United States Patent [19]

Moon

[11] Patent Number: 4,520,507
[45] Date of Patent: May 28, 1985

[54] LOW NOISE CATV CONVERTER
[75] Inventor: Frederick H. Moon, Mt. Prospect, Ill.
[73] Assignee: Zenith Electronics Corporation, Glenview, Ill.
[21] Appl. No.: 544,947
[22] Filed: Oct. 24, 1983
[51] Int. Cl.³ .......................... H04B 1/26; H04H 1/02
[52] U.S. Cl. ........................................ 455/3; 455/241; 455/249; 455/315; 455/131
[58] Field of Search .................. 455/3, 131, 241, 245, 455/248, 249, 315, 316, 189, 190, 200; 358/86

[56] References Cited
U.S. PATENT DOCUMENTS

| | | | |
|---|---|---|---|
| 3,577,103 | 5/1971 | Sparks | 333/17 |
| 3,800,229 | 3/1974 | Backwinkel et al. | |
| 3,801,915 | 1/1973 | Ostuni et al. | |
| 3,813,602 | 5/1974 | Van Dijum et al. | 333/81 R |
| 3,939,429 | 2/1976 | Lohn et al. | |
| 4,019,160 | 4/1977 | Kam | 333/81 R |
| 4,079,415 | 3/1978 | Will | 358/86 |
| 4,214,212 | 7/1980 | Dipietromaria | 455/315 |
| 4,270,212 | 5/1981 | Furukawa | 455/3 |
| 4,286,288 | 8/1981 | Waldo | 455/315 |
| 4,340,975 | 7/1982 | Onishi et al. | 455/315 |
| 4,352,209 | 9/1982 | Ma | 455/315 |
| 4,393,513 | 7/1983 | Yokogawa et al. | 455/249 |
| 4,419,768 | 12/1983 | Yamashita et al. | 455/189 |

Primary Examiner—Jin F. Ng

[57] ABSTRACT

A low noise frequency converter particularly adapted for the large bandwidth environment encountered in extended bandwidth cable television (CATV) systems is disclosed. The CATV converter includes an upconverter/downconverter combination for translating the received RF signal to an intermediate frequency (IF) carrier signal. A first IF signal is generated by heterodyning the received RF signal with the output of a voltage controlled oscillator in a first double balanced mixer. The upconverted signal thus produced is then mixed in a second double balanced mixer with the reference output of a second local oscillator to provide a fixed, downconverted second IF carrier signal. The upconverter portion of the CATV converter includes a pin diode attenuator between an RF amplifier and the first double balanced mixer. The pin diode attenuator is driven by the RF amplifier and is regulated by the signal receiver's automatic gain control (AGC) system permitting signal level to be increased at a faster rate than noise figure resulting in an improved converter signal-to-noise ratio and improved large signal handling capability. The downconverter portion of the CATV converter includes a double balanced diode mixer between the first IF amplifier and the second IF amplifier. With the double balanced diode mixer for the second mixer in the downconverter section, cross-modulation and intermodulation distortion from adjacent channels is reduced. In addition, the double balanced diode mixer provides an improved overall noise figure due to its lower noise performance than that available with either a single ended diode mixer or active mixer.

11 Claims, 8 Drawing Figures

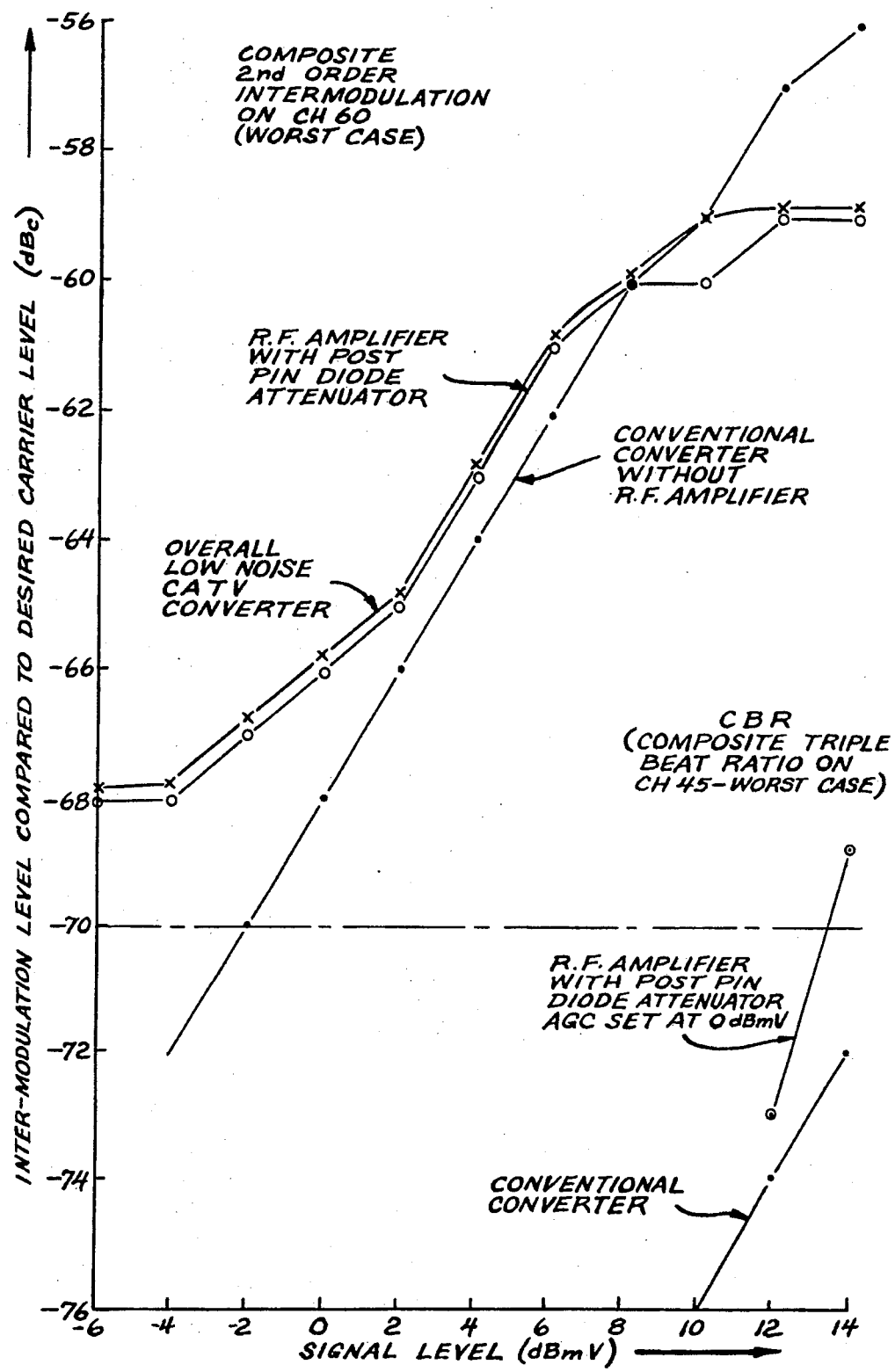

LOW NOISE CATV CONVERTER

BACKGROUND OF THE INVENTION

This invention relates generally to signal converters and is specifically directed to a signal converter particularly adapted for use in the widely varying, low signal level, large bandwidth environment encountered in extended bandwidth CATV systems.

A frequency converter, or translator, ideally processes a signal by frequency conversion and amplification, without significantly altering any signal characteristic except the amplitude and frequency. Frequency translation, either upward or downward, is a common technique used in many communication and navigation systems to take advantage of optimum signal processing characteristics of the equipment used in the system. The upward or downward conversion of the incoming RF signal to another RF frequency is accomplished by mixing the incoming RF signal with a reference frequency signal provided by a local oscillator to produce either an upconverted and/or a downconverted RF signal for subsequent processing in the receiver.

Now that cable television (CATV) is expanding rapidly into systems that will cover increasingly larger geographical areas with the increased demand for additional services and thus more channels, the need for techniques to improve or maintain quality performance is evident. Going from 300 MHz (35 channels) to 440 MHz (60 channels) or 500 MHz (70 channels) or even to 550 MHZ (77 channels) significantly increases the number of interference causing channels and degrades the composite triple beat performance in addition to increasing second order intermodulation and cross-modulation distortion. Also, extending to the higher frequencies increases cable losses in proportion to the square root of the frequency and a wider range of signal levels will more likely be encountered than the signal levels for narrower bandwidth 300 MHz CATV systems.

In order to maintain or improve the performance of 300 MHz CATV systems for the extended frequency bandwidth and effectively larger signal variation, a weak signal level requires amplification with low noise to achieve satisfactory signal-to-noise ratio and an extended frequency bandwidth along with a high signal level requiring larger signal handling capability. Low noise amplifier transistors which are gain reducible with biasing changes are more subject to modulation distortion than bipolar transistors with high current operation and high $f_T$ with practically no changes in noise figure and gain over a large range of collector currents. To further improve the dynamic range without significantly degrading the signal-to-noise ratio, variable attenuation is required to avoid modulation distortion in the converter.

In the past, television receiver circuits have been proposed in which a controlled PIN diode network is coupled to the input between the antenna and the preamplifier (RF amplifier) transistor in order to improve the dynamic range. These PIN diodes have an intrinsic layer between the p-region and the n-region. For RF signal currents, the PIN-diode primarily behaves as a resistor whose value is dependent on the DC biasing of the diode. Examples of such circuits can be found in U.S. Pat. Nos. 3,800,229 to Backwinkel et al, 3,813,602 to Van Dijum et al, 4,019,160 to Kam and 3,577,103 to Sparks. Prior art RF receivers incorporating a PIN diode attenuator feature have been directed toward use between the receiver's antenna input and the tuner in combination with an external driver for the PIN attenuator and have not relied upon preamplifier bias changes to improve the dynamic range of the transistor itself. Also, the PIN diode attenuator has not been used in a CATV signal environment in the past where signal level variation is substantially less than that encountered when signals are transmitted "on air" and also for narrower bandwidth operation U.S. Pat. No. 4,019,160 to Kam describes a signal attenuator circuit for a TV tuner where the PIN attenuator is used between the RF input and the RF amplifier, and also the AGC input voltage increases the input impedance of the transistor by reducing transistor current which reduces the noise slightly from the amplifier due to improved noise matching. However, the noise figure degradation is essentially in direct proportion to the attenuation achieved by the PIN diode attenuator and also, due to the AGC'able transistor amplifier, increased modulation distortion is produced compared with non-AGC'able high current transistors.

U.S. Pat. No. 3,800,229 to Backwinkel et al describes a gain controlled high-frequency input stage having a PIN diode network where a PIN-diode attenuator is used in front of the RF amplifier with the emitter voltage of the high current transistor serving as the reference voltage for the PIN diode network. U.S. Pat. No. 3,813,602 to Van Dijum et al discloses a PIN diode attenuator at the input of the RF amplifier. U.S. Pat. No. 3,577,103 to Sparks describes a variable attenuator for a wave signal receiver where a separate transistor is used to drive a PIN diode attenuator which is used at the RF input circuit between the receiver's antenna and the tuner's input.

Most CATV converters are those of the up/down conversion type where neither RF amplifier or variable attenuator circuits are utilized. This has been due to the fact that the frequency bandwidth has been only up to 300 MHz (35 channels) and the signal level over the frequency band over which these converters are utilized is more easily and accurately controlled.

One example of a CATV frequency converter for selectively providing access to only predetermined channels is disclosed in U.S. Pat. No. 4,079,415 to Will. This converter up-converts 50 to 300 MHz to 500 to 750 MHz and involves a single conversion converter. Due to insufficient selectivity at the second conversion which takes place in the UHF TV tuner, adjacent channel cross-modulation and intermodulation is excessive and unsatisfactory.

Another example of a frequency converter is set forth in U.S. Pat. No. 3,939,429 to Lohn et al which discloses double conversion in a television receiver tuner. The RF amplifier is external and there is no PIN diode attenuator between the RF amplifier and the first mixer.

Yet another example of a frequency converter is set forth in U.S. Pat. No. 3,801,915 to Ostuni et al which discloses double conversion in the CATV converter without either an RF amplifier or PIN-diode attenuator and the use of an active mixer. This system suffers from a high noise figure and is more susceptible to modulation distortion. U.S. Pat. No. 4,270,212 to Furukawa is directed to bypassing a CATV converter when the input channel is the same as the converter output frequency. The AGC circuit and attenuator are placed at the output of the CATV converter and do not improve either the noise figure or dynamic range of the converter. U.S. Pat. No. 4,352,209 to Ma also provides up and down frequency conversion in a CATV converter.

Therefore, in view of the above, the present invention provides a low noise CATV converter involving the upconversion and downconversion of a received CATV signal which is amplified at the input stage of the converter. Modulation distortion due to increased signal level at the mixer stage due to a low noise RF amplifier is compensated for by the unique application of a PIN diode attenuator and is further reduced by a unique biasing network for the RF amplifier transistor and PIN diode attenuator.

OBJECTS OF THE PRESENT INVENTION

Accordingly, it is an object of the present invention to provide an improved low noise, low cost CATV converter.

It is another object of the present invention to provide an inexpensive wideband CATV converter wherein mixer cross-modulation and intermodulation distortion is minimized without a complex input amplifier/filter network.

Still another object of the present invention is to provide a frequency converter capable of operating at widely varying signal levels as well as over large bandwidths.

A still further object of the present invention is to improve signal-to-noise ratio in a CATV signal receiver having a frequency converter including an input signal amplification stage followed by a PIN diode attenuator utilizing an automatic gain control (AGC) feedback arrangement to achieve optimum overall performance in the CATV receiver.

BRIEF DESCRIPTION OF THE DRAWINGS

The appended claims set forth those novel features believed characteristic of the invention. However, the invention itself, as well as further objects and advantages thereof, will best be understood with reference to the following detailed description of a preferred embodiment taken in conjunction with the accompanying drawings, wherein like reference numerals identify like elements, in which:

FIGS. 4A–4D illustrate the variation of selected system operating parameters of a CATV converter as shown in FIGS. 1 and 2.

DESCRIPTION OF THE PREFERRED EMBODIMENT

Figure 1:
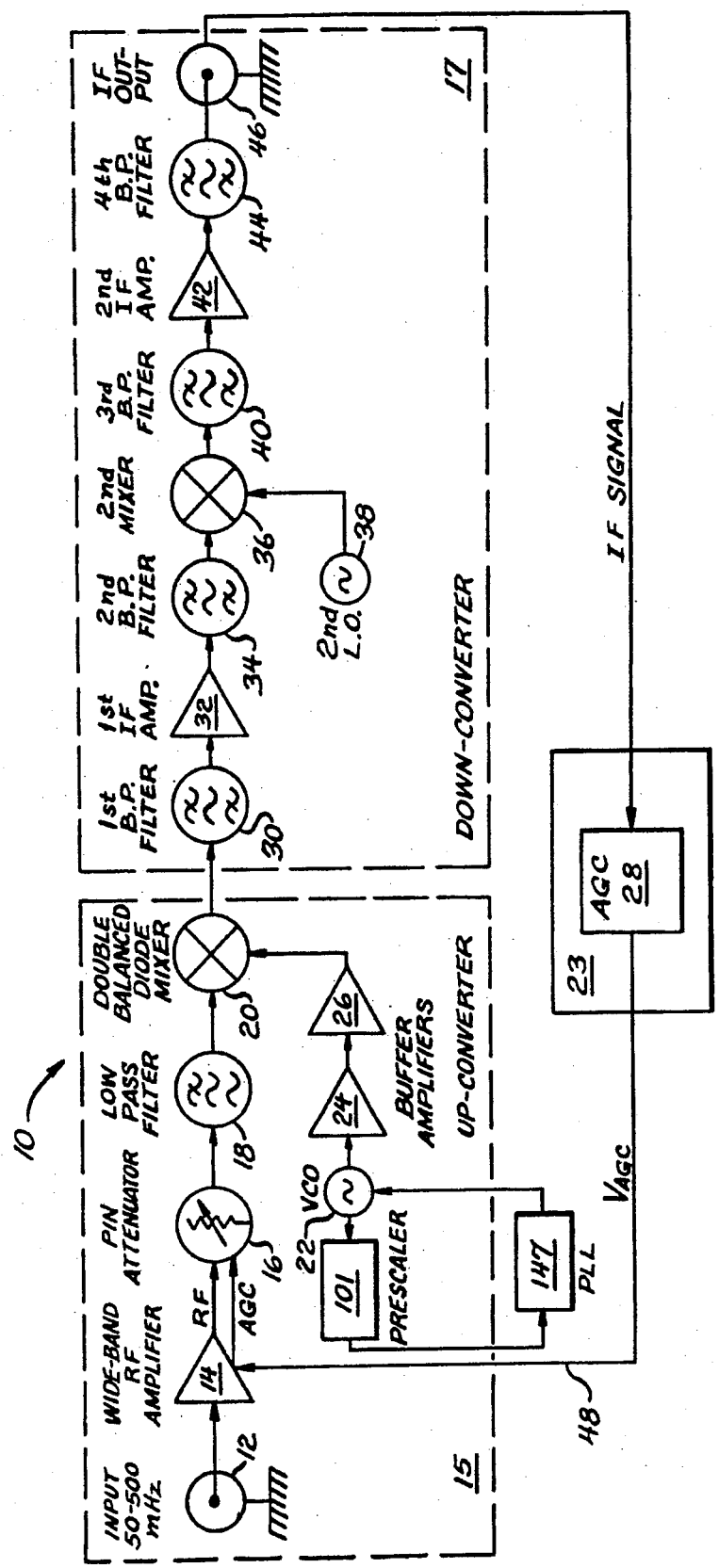
FIG. 1 is a simplified functional block diagram of a low noise CATV converter in accordance with the present invention.

Referring to FIG. 1, there is shown a CATV converter 10 in accordance with a preferred embodiment of the present invention. CATV converter 10 includes an up-converter portion 15 for translating the received RF signal to a higher frequency and a down-converter portion 17 for receiving and translating to a lower frequency the output of the up-converter portion 15.

More specifically, an RF input signal is provided to an input terminal 12 in the up-converter portion 15 of the CATV converter 10. In a preferred embodiment of the present invention, the RF input signal may vary in frequency from 50-500 MHz. Input terminal 12 is coupled and provides an input to a wideband RF amplifier 14. The amplified output of the RF amplifier 14 is then provided to a PIN-diode attenuator 16 which attenuates the RF signal in a manner described below as determined by the automatic gain control (AGC) system 28 in signal processing circuit 23 to which the CATV converter 10 is coupled.

An RF signal is then provided by PIN diode attenuator 16 to a low pass filter 18, with the filtered output thereof thence provided to a double balanced diode mixer 20. To the other input of the double balanced diode mixer 20 is provided a variable frequency signal output by a voltage controlled oscillator (VCO) 22 and amplified by buffer amplifiers 24, 26. The voltage controlled oscillator output signal is of variable frequency as determined by the selected channel number and is prevented from entering the RF amplifier 14 and the PIN diode attenuator 16 by the low pass filter 18. The filtered and amplified RF input signal is then heterodyned with the VCO output signal in the double balanced diode mixer 20 to produce a first intermediate frequency (IF) signal which is provided to the down-converter portion 17 of the CATV converter 10.

Figure 2:
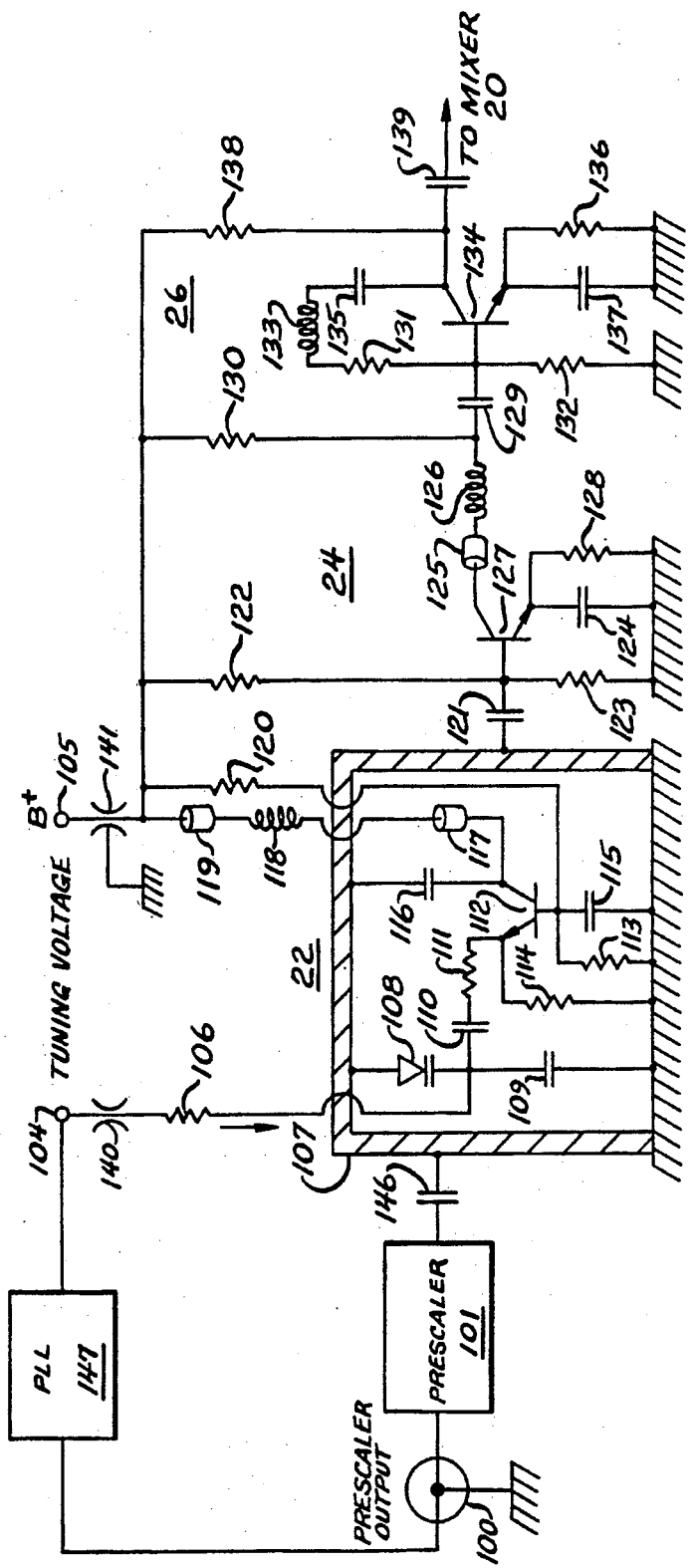
FIG. 2 is a combined block and schematic diagram of a voltage controlled oscillator and two stage buffer amplifier utilized in the CATV converter of FIG. 1.

Referring to FIG. 2, the VCO 22 is comprised of a variable capacitance diode 108 and a half-wave printed resonant transmission line 107 which maintains consistently constant transmission line characteristics and offers advantages over a quarter wave resonant transmission line particularly in obtaining high frequency resonance with much more reasonable mechanical dimensions such as the length and width of the line. Resistor 111 and capacitor 110 provide frequency-dependent positive feedback to obtain a satisfactory oscillation over the entire band, in this case from 668 MHz to 1106 MHz. Capacitor 109 in series with the varactor diode 108 establishes the overall tuning range and provides the aforementioned frequency-dependent positive feedback. Resistors 113, 114 and 120 and the RF choke 118 form a DC biasing network for the oscillator transistor 112. Capacitor 115 is a bypass capacitor for the base electrode of the oscillator transistor 112 while ferrite beads 117 and 119 function as lossy inductors in suppressing spurious signals generated by the oscillator transistor 112. Capacitor 116 couples the collector electrode of the oscillator transistor 112 to the resonant element 107 and capacitor 146 couples the VCO output to prescaler 101 which divides the VCO frequency down to a lower frequency and provides the thus divided down signal to phase locked loop 147 via output terminal 100 in providing the proper tuning voltage for the VCO 22. Resistor 106 is used to apply the tuning voltage to VCO 22 while capacitors 140 and 141 are bypass capacitors for isolating the B+ supply source and tuning voltage source from VCO 22 and buffer amplifiers 24, 26. Capacitor 121 couples the VCO output to the first buffer amplifier 24 which amplifies the output level of the VCO and also acts as a buffer amplifier. Resistors 122, 123, 128 and 130 provide DC biasing for the NPN buffer transistor 127. Capacitor 124 is a bypass capacitor for the emitter of transistor 127, and ferrite bead 125, inductor 126 and AC coupling capacitor 129 provide the amplified VCO signal to the second buffer amplifier stage 26 for further amplification to a signal level suitable for the double balanced diode mixer 20 shown in FIG. 1.

The second buffer amplifier 26 is a wide band RF amplifier with flat gain and constant output impedance which is ideal for the operation of the double balanced diode mixer 20 shown in FIG. 1 to which the second buffer amplifier 26 is coupled. The second buffer amplifier 26 includes an NPN buffer transistor 134 to the base of which the output of the first buffer amplifier 24 is provided. Grounded resistor 132 coupled to the base of transistor 134 and resistors 138 and 142 provide proper biasing therefor, while the grounded parallel arrangement of resistor 136 and capacitor 137 couples the emitter of transistor 134 to ground and provides a frequency-dependent negative feedback to achieve equal gain and also equal and constant termination impedance over the operating frequency band for the buffer amplifier transistor 134. Resistor 131, inductor 133 and capacitor 135 serially coupled across the base-collector junction of transistor 134 provide a negative feedback arrangement in providing for general uniform gain across the entire bandwidth for the buffer amplifier transistor 134, while permitting the input and output impedances to be uniformly matched to the termination impedance. Capacitor 139 provides a DC blocking and AC coupling function for the output of buffer amplifier 26 provided to the double balanced diode mixer 20.

In a preferred embodiment, the voltage controlled oscillator output signal may vary in frequency from 668–1106 MHz. Thus, with the RF input signal frequency bandwidth covering a predetermined number of CATV channels, and the VCO output signal frequency representing a selected channel, a fixed IF signal frequency higher than the highest RF input frequency will be generated by the up-converter portion 15 of the CATV converter 10. This arrangement reduces the possibility of image frequency interference with the received RF signal.

Figure 5:
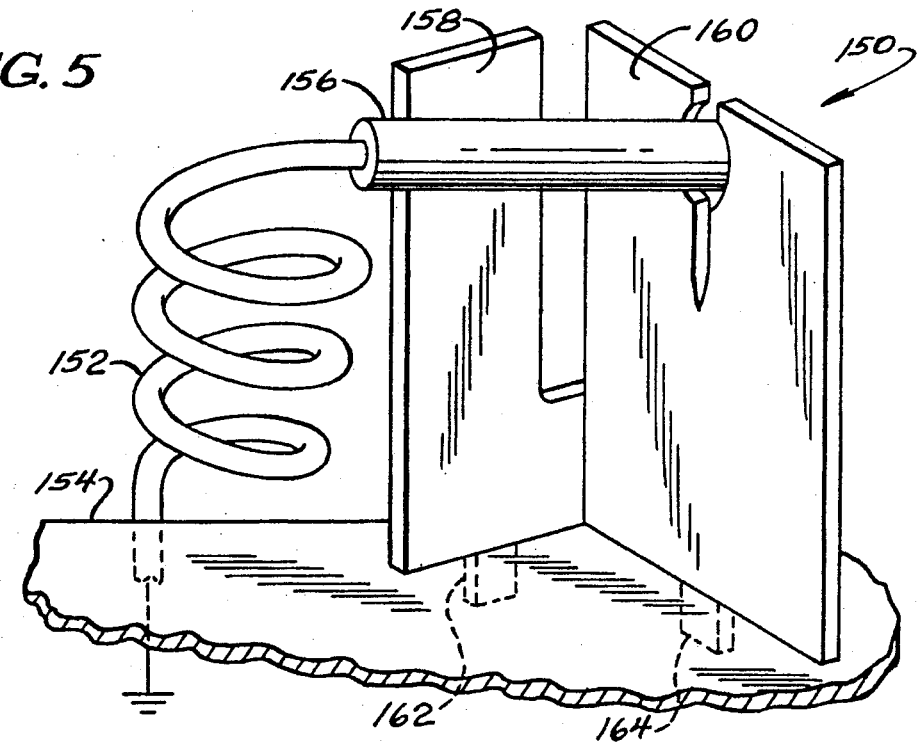
FIG. 5 is a perspective view of an IF bandpass filter arrangement which includes a high Q helical resonator coil and capacitive trimmer and which also serves as a low loss mechanical tie point.

The first IF signal is initially provided to a first bandpass filter 30 in the down-converter portion 17 of the CATV converter 10. The first IF bandpass filter 30 includes a pair of coupled, similar low loss resonant circuit elements. One of the these low loss resonant circuit elements 150 is shown in perspective view in FIG. 5. The resonant circuit element 150 includes a helical coil 152 coupled at one end to a point of ground potential on circuit board 154. The other end of helical coil 152 is inserted through teflon sleeving 156. The helical coil 152 and teflon sleeving 156 are supported by a slotted support plate 160 which is integrally formed with a capacitive trimmer plate 158, the capacity of which is adjustable by displacement thereof toward and away from teflon sleeving 156. Capacitive trimmer 158 and slotted support plate 160 each includes a respective mounting insert 162, 164 for stable mounting on circuit board 154. The helical coil 152 has a high Q value while the slotted support plate 160 acts as a low capacitance, low loss mechanical tie point for the helical coil in each of the respective resonant circuit elements.

The center frequency of the first bandpass filter 30 is selected to be ~610 MHz, or the frequency of the first IF signal, in a preferred embodiment. This filtered first IF signal is then provided to a first IF amplifier 32 for the amplification thereof and thence to a second bandpass filter 34. The output of the second bandpass filter 34 is thence provided to a second mixer 36 to which is also provided the fixed frequency output of a second local oscillator 38. In a preferred embodiment, the second local oscillator frequency is 567 MHz producing a second IF signal output from the second mixer 36 at the standard picture carrier IF frequency of 45.75 MHz.

The second IF signal is then provided to a third bandpass filter 40 and thence to a second IF amplifier 42 for the amplification thereof. The amplified output of the second IF amplifier 42 is provided to a fourth bandpass filter 44 and thence to an IF output terminal 46. The IF output terminal 46 is coupled to a signal processing circuit 23 which includes conventional IF signal processing circuitry (not shown) for the processing of the IF output signal. In addition, signal processing circuit 23 includes an automatic gain control (AGC) system 28 which detects the signal level of the IF output signal and provides a gain control signal to the IF amplifier (not shown) as required. This control signal is also provided from the AGC system 28 to the wideband RF amplifier 14 and the PIN diode attenuator 16 for processing therein in a manner described in the following paragraphs.

Figure 3:
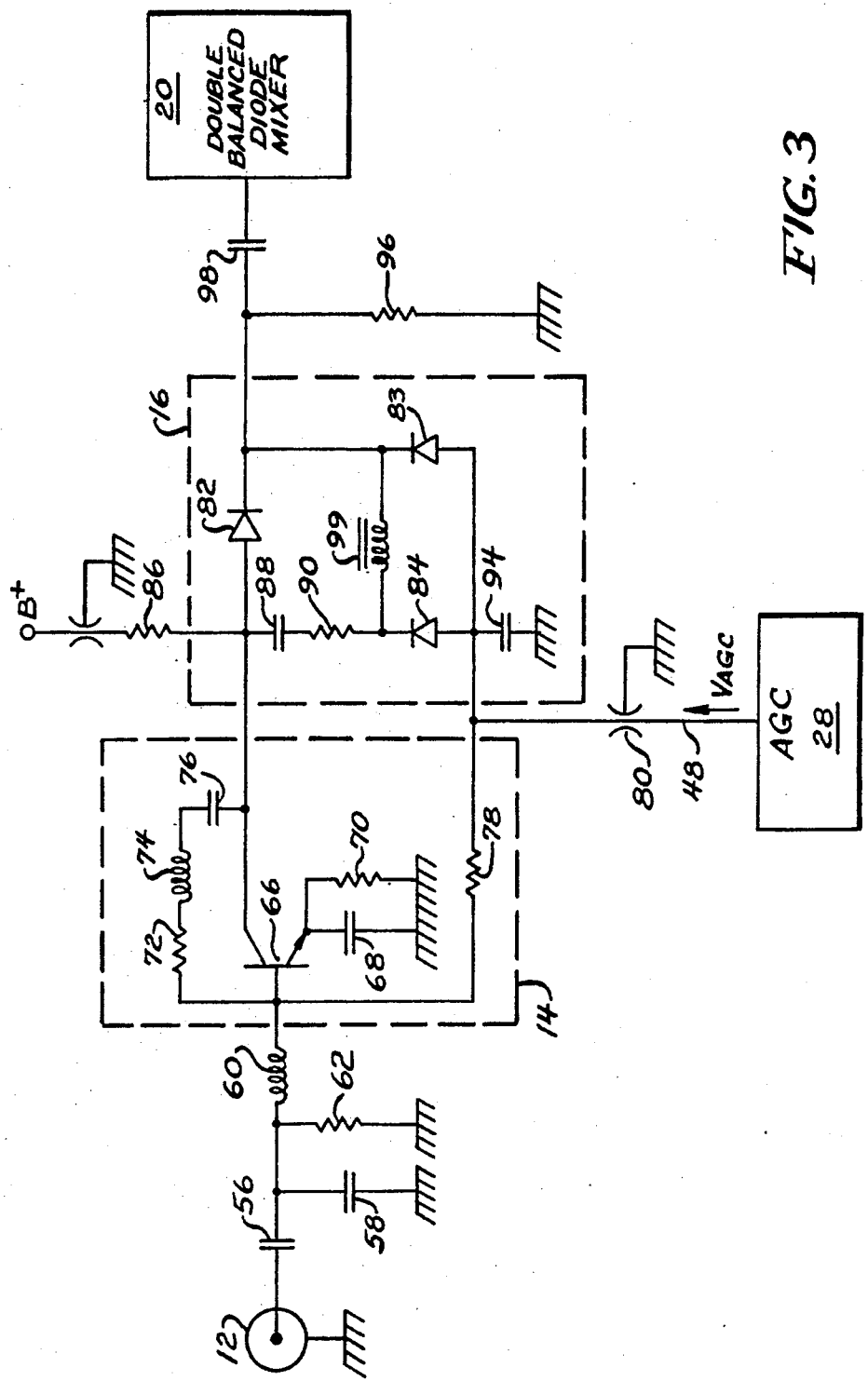
FIG. 3 is a schematic diagram of a variable attenuation arrangement for an amplified RF signal for use in the CATV converter of FIG. 1.

Referring to FIG. 3, there is shown in schematic diagram form the combination of wideband RF amplifier 14 and PIN diode attenuator 16 to which the AGC feedback signal, $V_{AGC}$, is provided from the signal processing circuit (not shown in FIG. 3) which includes AGC system 28. The received CATV signal is provided to the input terminal 12 and thence to the wideband RF amplifier 14. The RF amplifier 14 includes a bipolar NPN transistor 66, to the base of which is provided the received CATV signal via a DC blocking capacitor 56. Proper biasing for transistor 66 is provided by grounded resistor 62. Grounded capacitor 58 and inductor 60 coupled to the base of transistor 66 further improve impedance matching of RF amplifier 14 at the high end of the operating frequency spectrum, i.e., ~500 MHz. NPN transistor 66 is a non-AGC'able device in that its gain is essentially unaffected by increases in the bias voltage applied thereto. The grounded parallel arrangement of capacitor 68 and resistor 70 couples the emitter of NPN transistor 66 to ground and provides frequency-dependent negative feedback to achieve equal gain and also equal and constant termination impedance over the frequency band for the RF amplifier transistor 66. As the frequency of the RF input signal increases, the impedance of the emitter-coupled, grounded, parallel arrangement of capacitor 68 and resistor 70 decreases such that at the high end of the frequency band this capacitor and resistor combination serves virtually as an RF signal bypass. At lower frequencies, less of the RF input signal is bypassed by capacitor 68 and resistor 70 which thus operate as a frequency-dependent negative feedback network for the RF amplifier 14.

A series feedback arrangement is coupled across the collector-base junction of transistor 66 and includes serially coupled resistor 72, inductor 74 and capacitor 76. Capacitor 76 performs a DC blocking function while the impedance of the combination of resistor 72 and inductor 74 increases at the high end of the frequency band resulting in virtually no feedback signal being provided from the collector to the base of transistor 66. However, as the frequency of the RF signal provided to the base of transistor 66 decreases, the collector-base impedance of the components coupled serially thereacross decreases resulting in a frequency-dependent negative feedback to achieve equal gain and also equal input and output terminations over the frequency band for the RF amplifier transistor 66. The aforementioned frequency-dependent negative feedback networks therefore reinforce each other over the RF operating spectrum in providing for generally uniform gain across the entire bandwidth and also permitting the input and output impedances to be uniformly matched to the termination impedance.

The output of the RF amplifier 14 is provided to the PIN diode attenuator 16 which includes a PIN diode network comprised of diodes 82, 83 and 84, resistor 90, capacitor 88 and an RF choke 99. A DC B+ source is coupled across the PIN diode attenuator 16. Under zero attenuation conditions, diodes 83, 84 are nonconductive and the output of the RF amplifier 14 is provided via forward-biased diode 82 and coupling capacitor 98 to low pass filter 18 and double balanced diode mixer 20. Capacitor 98 provides AC coupling for the RF signal output of PIN diode attenuator 16 to the double balanced diode mixer 20.

Attenuation of this RF output signal is provided in the present invention in the following manner. As shown in FIG. 3, an AGC signal is fed back from the signal processing circuit (not shown) to which the CATV converter 10 is connected to the wideband RF amplifier 14 and the PIN diode attenuator 16 via an AGC feedback line 48. Coupled to the AGC feedback line 48 is a feed-through capacitor 80 which is coupled via resistor 78 to the base of transistor 66. A forward AGC voltage is applied to the base of the bipolar feedback RF amplifier transistor 66, with the collector current thereof increasing as the signal level increases. The reduced anode voltage of the serially connected diode 82 due to the increased IR drop across resistor 78 and the increased anode voltages of shunt connected diodes 83 and 84 due to increased AGC voltage reduce the current through serially connected diode 82 thereby increasing the serial branch impedance and increasing the current through shunt connected diodes 83 and 84 thereby reducing shunt branch impedance as the forward AGC voltage is applied. The IR drop across resistor 96 provides reverse bias on shunt connected diodes 83 and 84 at maximum gain bias and also provides reverse bias for the serially connected diode 82 at the cut-off bias (maximum attenuation). Resistor 90, the value of which is selected to be approximately equal to the output impedance of RF amplifier 14, maintains the same output impedance termination even when shunt connected diode 84 is fully forward-biased and provides an RF short to ground. This limits input impedance variation of the RF amplifier 14 due to the wide variation of the output load impedance otherwise exhibited by the PIN diode attenuator 16. With $V_{AGC}$ at a minimum value, diode 82 is completely forward biased and diodes 83 and 84 are reverse biased and nonconducting, resulting in an RF signal of maximum amplification being provided to double balanced diode mixer 20 via low pass filter 18. With $V_{AGC}$ at a maximum value for a large signal, diode 82 is reverse biased and diodes 83 and 84 are forward biased resulting in an RF signal level reduction for the double balanced diode mixer 20 and the following stages thereby reducing modulation distortion which would otherwise have been produced.

Figure 4A:
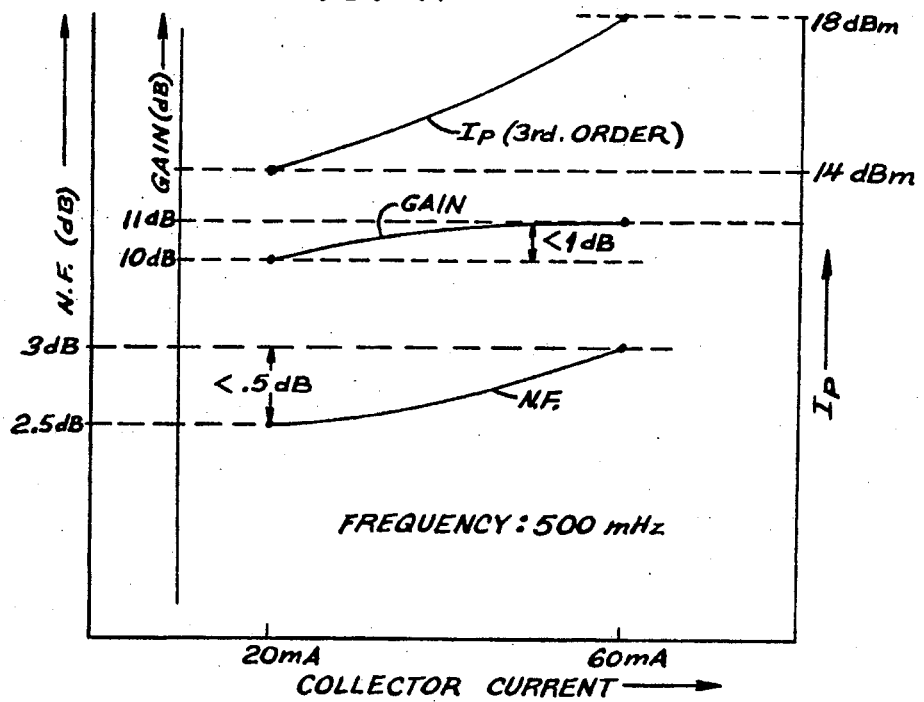

With the AGC voltage applied to the RF amplifier transistor 66, even though the transistor itself does not possess gain reduction characteristics, the collector current ($I_c$) of the RF amplifier transistor 66 increases as the input signal level increases which results in performance characteristics as shown in FIG. 4A.

Referring to FIG. 4A, as the collector current increases from 25 to 60 mA, which is approximately the collector current increase corresponding to the AGC operating range, the large signal handling capability increases as evidenced by an increase in the 3rd order intermodulation intercept point level by about 4 dB while the noise figure (N.F.) and gain increase slightly (~0.5 dB in N.F. and ~1 dB in gain). The intermodulation intercept point (IP) represents system non-linear (or linear) characteristics and is defined as the signal level which would produce the intermodulation product equal in magnitude to the desired carrier signal level.

In addition to the large signal handling characteristics of the high current bipolar RF transistor 66 and the particular biasing method utilized, the RF amplifier 14 with frequency-dependent negative feedback circuits exhibits flat gain and constant impedance terminations over a wide frequency band. In addition, RF amplifier 14 substantially reduces modulation distortion such as intermodulation and cross-modulation due to the negative feedback.

Figure 4B:
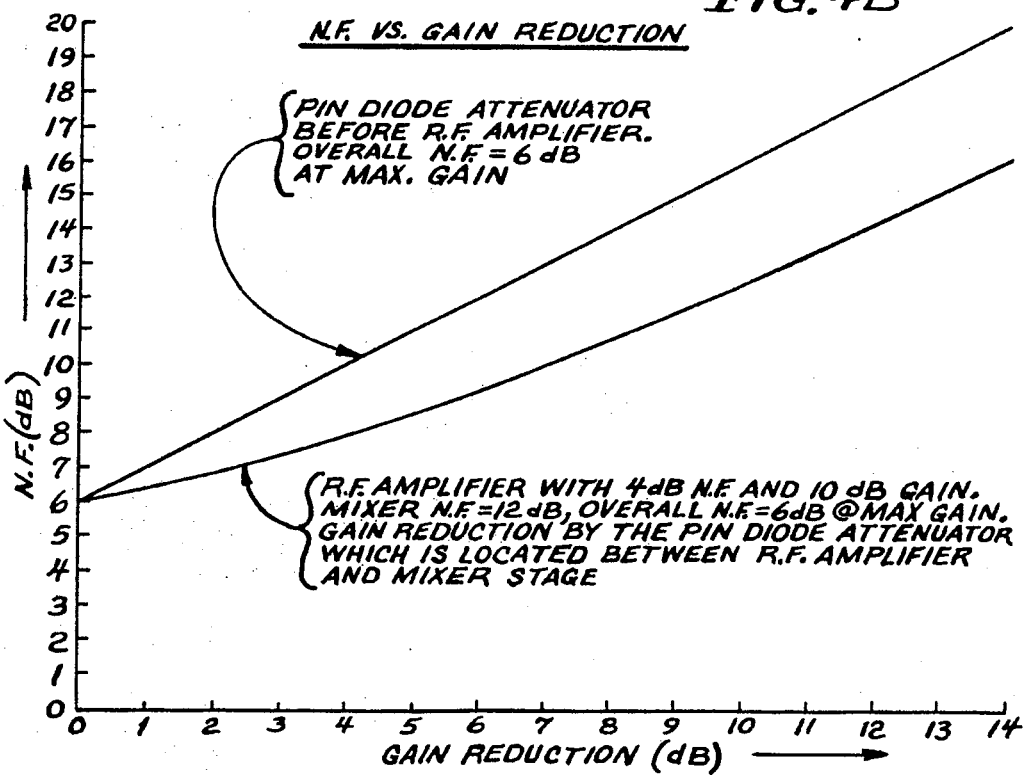
Figure 4C:
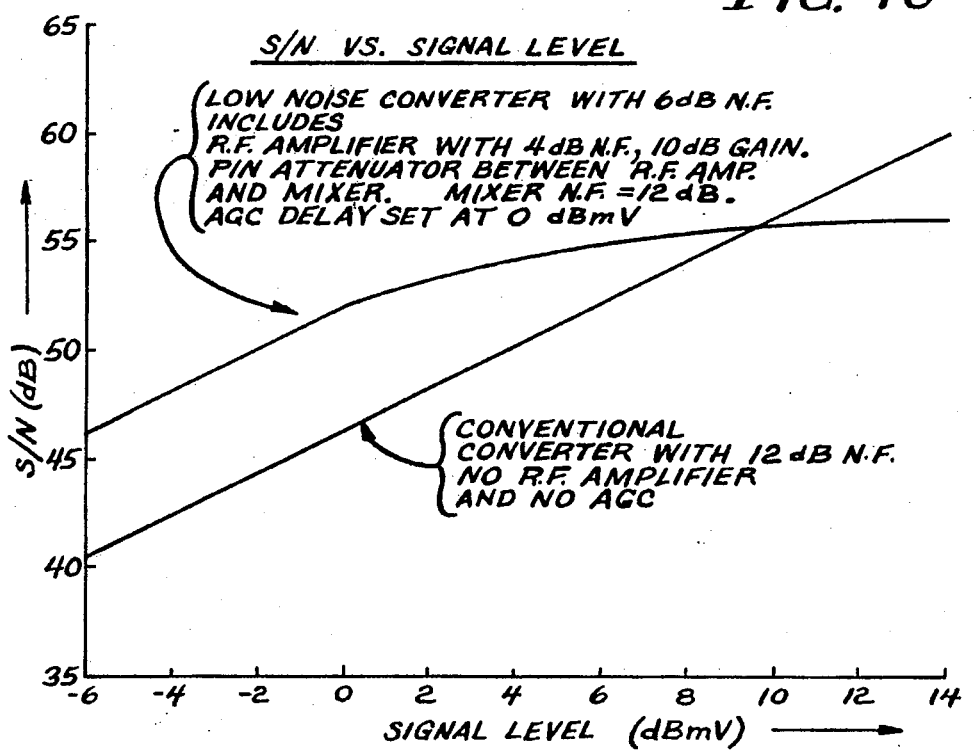

The noise figure (N.F.) increase due to the reduced overall gain of the RF amplifier 14 and the PIN diode attenuator 16 is illustrated in FIG. 4B which shows the reduced rate of N.F. increase as compared with the case where PIN diode attenuator 16 is located in front of RF amplifier 14. This arrangement also provides high signal-to-noise (S/N) ratio over most of the signal level range for the low noise CATV converter as shown in FIG. 4C when compared with the conventional CATV converter with a 12 dB N.F. and without an RF amplifier and AGC. A 6 dB higher S/N ratio up to the signal level of 0 dBmV corresponds to a 6 dB N.F. difference. The large S/N margin decreases until the N.F. of the low noise converter increases with gain reduction so as to equal (at 2 dB) that of a conventional CATV converter without an RF amplifier and AGC. This occurs at ~10 dB gain reduction and ~10 dBmV signal level with the S/N ratio equal to ~56 dB. For signal levels in excess of 10 dBmV, the conventional CATV converter provides a higher S/N ratio compared with the low noise CATV converter of the present invention with an RF amplifier and a PIN diode attenuator. However, a further increase in the S/N ratio beyond 56 dB is not critical because 56 dB of S/N ratio is quite satisfactory.

FIG. 4D presents a comparison of the composite second order and composite triple beat ratio of the low noise CATV converter of the present invention and the composite second order and composite triple beat ratio of a conventional CATV converter having an RF amplifier and a PIN diode attenuator. The composite second order beat ranges from −59 dB$_c$ to −68 dB$_c$ for a low noise CATV converter with an RF amplifier and a PIN diode attenuator in accordance with the present invention with the AGC delay set at 0 dBmV signal level. For a conventional CATV converter the composite second order beat ratio ranges from below −65 dB$_c$ to −70 dB$_c$. For the low signal level range, low modulation products due to the low input signal level and modulation distortion well below −60 dB$_c$ are not particularly desirable because no visual improvements are noticeable. The signal range where improvements in a conventional CATV converter are needed is at the high end of the signal range, and the low noise CATV converter of the present invention provides these improvements as shown in FIG. 4D. The improvement is due to the lower signal level at the mixer input because of the magnitude of the RF amplifier gain and the PIN diode attenuation difference.

The same trend is also true for the composite triple beat ratio as shown in FIG. 4D. However, the composite triple beat ratio is low for both cases and is below $-69$ dB$_c$ at any signal level. The cross-modulation also was found to be well below $-65$ dB$_c$ at any signal level for the low noise CATV converter of the present invention as well as a conventional CATV converter.

There has thus been shown a low noise CATV frequency converter utilizing a PIN diode attenuator between an RF amplifier and a first double balanced diode mixer stage. An IF signal amplitude-responsive AGC signal is fed back to the RF amplifier and PIN diode attenuator for providing proper attenuation of the received RF signal to minimize cross- and intermodulation distortion in the converter's mixer stage over a wide received signal bandwidth.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matters set forth in the foregoing description and accompanying drawings is offered by way of illustration only and not as a limitation. The actual scope of the invention is intended to be defined in the following claims when viewed in their proper perspective based on the prior art.

I claim:

1. In a CATV signal converter coupled to a signal processing circuit wherein a received CATV signal is initially upconverted to a first, higher IF signal and then downconverted to a second, lower IF signal and then provided to said signal processing circuit, said signal processing circuit including an automatic gain control (AGC) system responsive to the level of said second IF signal, a frequency upconverter comprising:
    a low noise wideband RF amplifier having a controllable operating point for amplifying said received CATV signal wherein the gain and terminal impedance of said amplifier are maintained substantially constant over a wide frequency band;
    variable attenuation means coupled to said RF amplifier for the selective attenuation of the amplified CATV signal;
    an oscillator for generating a reference signal having a selected frequency;
    a mixer coupled to said variable attenuation means and said oscillator for mixing said amplified CATV and reference signals to produce said first, higher IF signal; and
    means coupling said AGC system to said RF amplifier and said variable attenuation means for controlling the operating point of said RF amplifier and for controlling the amount of attenuation of the amplified CATV signal by said variable attenuation means in response to an AGC control signal provided by said signal processing circuit.

2. A frequency upconverter in accordance with claim 1 further including a low pass filter coupled between said variable attenuation means and said mixer.

3. A frequency upconverter in accordance with claim 1 wherein said wideband RF amplifier includes a high current bipolar transistor and biasing network coupled thereto.

4. A frequency upconverter in accordance with claim 3 wherein said high current bipolar transistor is an NPN transistor having base, emitter and collector electrodes with the received CATV and AGC control signals provided to the base electrode thereof.

5. A frequency upconverter in accordance with claim 4 further including series and shunt negative feedback networks coupled respectively across emitter-ground and base-collector junctions of said NPN transistor in providing for frequency-dependent negative feedback and selective attenuation as well as a flat gain characteristic and constant termination impedance in said wideband RF amplifier.

6. A frequency upconverter in accordance with claim 3 wherein said variable attenuation means includes a PIN diode network.

7. A frequency upconverter in accordance with claim 5 further including a controllable DC source coupled to said PIN diode network for providing proper biasing thereto.

8. A frequency upconverter in accordance with claim 6 wherein said PIN diode network includes a first serially connected diode and second shunt connected diodes coupled to said RF amplifier and to said AGC system and rendered conductive and nonconductive in a reciprocal manner such that with a low received CATV signal level, said first serially connected diode is rendered substantially conductive and said second shunt diodes are rendered substantially nonconductive, and with high received CATV signal levels, said first serially connected diode is rendered substantially nonconductive and said second shunt diodes are rendered substantially conductive for providing proper attenuation of said CATV signal.

9. A CATV frequency converter comprising:
    a low noise wideband RF amplifier having a controllable operating point for amplifying a received CATV signal wherein the gain and terminal impedance of said amplifier are maintained substantially constant over a wide frequency band;
    variable attenuation means coupled to said RF amplifier for the controlled attenuation of the amplified CATV signal;
    an oscillator for generating a reference signal having a selected frequency;
    a mixer coupled to said variable attenuation means and said oscillator for mixing said amplified CATV and reference signal to produce an IF signal;
    an automatic gain control (AGC) system coupled to said mixer for developing an AGC control signal as a function of the level of the received CATV signal; and
    means coupling the AGC control signal to said RF amplifier for controlling the operating point thereof and to said variable attenuation means, the attenuation of said variable attenuation means being controlled in response to said AGC control signal and the output of said RF amplifier.

10. A CATV frequency converter according to claim 9 wherein said variable attenuation means comprises a PIN diode network controlled in response to said AGC control signal for attenuating the amplified CATV signal in direct relation to the level of the received CATV signal.

11. A CATV frequency converter according to claim 9 including down-converting means for coupling said IF signal to said AGC system.